United States Patent [19]
Chen et al.

[11] Patent Number: 5,619,063
[45] Date of Patent: Apr. 8, 1997

[54] EDGELESS, SELF-ALIGNED, DIFFERENTIAL OXIDATION ENHANCED AND DIFUSION-CONTROLLED MINIMUM-GEOMETRY ANTIFUSE AND METHOD OF FABRICATION

[75] Inventors: Wenn-Jei Chen, Sunnyvale; Huang-Chung Tseng, Santa Clara, both of Calif.

[73] Assignee: Actel Corporation, Sunnyvale, Calif.

[21] Appl. No.: 646,382

[22] Filed: Dec. 12, 1995

Related U.S. Application Data

[63] Continuation of Ser. No. 329,705, Oct. 25, 1994, abandoned, which is a continuation-in-part of Ser. No. 277,673, Jul. 19, 1994, Pat. No. 5,519,248, which is a continuation of Ser. No. 87,942, Jul. 7, 1993, Pat. No. 5,369,054, Ser. No. 290,029, Aug. 12, 1994, Pat. No. 5,498,895, and Ser. No. 289,678, Aug. 12, 1994, Pat. No. 5,572,061.

[51] Int. Cl.$^6$ .................................................... H01L 29/00
[52] U.S. Cl. ............................ 257/530; 257/637; 437/21; 437/922; 437/947
[58] Field of Search .................................. 257/530, 637; 437/922, 21, 947

[56] References Cited

U.S. PATENT DOCUMENTS

| | | |
|---|---|---|
| 4,748,490 | 5/1988 | Hollingsworth . |
| 4,823,181 | 4/1989 | Mohsen et al. . |
| 4,851,364 | 7/1989 | Yatsuda et al. . |
| 4,866,001 | 9/1989 | Pickett et al. . |
| 4,868,138 | 9/1989 | Chan et al. . |
| 4,899,205 | 2/1990 | Hamdy et al. . |
| 4,997,790 | 4/1991 | Woo et al. . |
| 5,057,451 | 10/1991 | McCollum . |
| 5,061,646 | 10/1991 | Sivan et al. . |
| 5,070,384 | 12/1991 | McCollum et al. . |
| 5,087,958 | 2/1992 | Chen et al. . |
| 5,110,754 | 5/1992 | Lowrey et al. . |
| 5,134,457 | 7/1992 | Hamdy et al. . |

(List continued on next page.)

FOREIGN PATENT DOCUMENTS 0416903  3/1991  European Pat. Off. .

OTHER PUBLICATIONS

K.E. Gordon et al. "Conducting Filament of the Programmed Metal Electrode Amorphous Silicon Antifuse", IEDM 93 (Dec. 1993) pp. 27–30.

*Primary Examiner*—J. Carroll
*Attorney, Agent, or Firm*—D'Alessandro & Ritchie

[57] ABSTRACT

The present invention is directed to an antifuse structure and fabrication process wherein the bottom oxide of the ONO antifuse material layer is grown over a small area of N– diffusion surrounded by an N+ diffusion area where the N– diffusion could be patterned as N– "islands" or as N– "stripes", or the like, with the active N– area controlled by the formation and drive-in of the N+ diffusion layer. In this way, the bottom oxide layer of the ONO antifuse material layer is thinner at its center (above the N– region) than at its edges because oxide grows slower on the less doped N– region at the center of the antifuse than at the more heavily doped N+ regions at the edges of the antifuse. Forcing the center of the antifuse material layer to be thinner causes the antifuse to preferentially break down at its center and away from its edges. The opening in the antifuse cell opening mask is wider than the width of the N– diffusion area so that both N– and N+ areas are exposed in the antifuse cell opening step. Since the N+ diffusion can be very accurately dimensionally controlled with known techniques, it is thus possible to reduce the dimension of the active N– diffusion down to 0.2 µm or below, comparing favorably with the linear dimension of 1.0 µm used in currently available state-of-the-art manufacturing processes for antifuses. This represents a factor of 25 reduction in the active antifuse area, which in turn can dramatically reduce the defect density of antifuses over current technology and/or dramatically increase the number of antifuses that may be disposed in a given area of silicon.

27 Claims, 6 Drawing Sheets

U.S. PATENT DOCUMENTS

| | | | |
|---|---|---|---|
| 5,163,180 | 11/1992 | Eltoukhy et al. | 257/530 |
| 5,166,556 | 11/1992 | Hsu et al. . | |
| 5,171,715 | 12/1992 | Husher et al. . | |
| 5,196,724 | 3/1993 | Gordon et al. | 257/530 |
| 5,208,177 | 5/1993 | Lee | 257/530 |
| 5,223,217 | 8/1993 | Dixit et al. . | |
| 5,266,829 | 11/1993 | Hamdy et al. . | |
| 5,282,158 | 1/1994 | Lee | 257/530 |
| 5,290,734 | 4/1994 | Boardman et al. . | |

EDGELESS, SELF-ALIGNED, DIFFERENTIAL OXIDATION ENHANCED AND DIFUSION-CONTROLLED MINIMUM-GEOMETRY ANTIFUSE AND METHOD OF FABRICATION

CROSS REFERENCE TO RELATED APPLICATIONS

This application is a continuation of U.S. patent application Ser. No. 08/329,705 filed Oct. 25, 1994 abandoned which is, in turn, a continuation-in-part of: (1) U.S. patent application Ser. No. 08/277,673 filed Jul. 19, 1994 (now U.S. Pat. No. 5,519,248 granted May 21, 1996) in the names of inventors Yeouchung Yen, Wenn-Jei Chen, Steve S. Chiang and Abdul R. Forouhi and entitled "Circuits for ESD Protection of Metal-to-Metal Antifuses During Processing" and assigned to Actel Corporation [ACT-137] which is, in turn, a continuation of U.S. patent application Ser. No. 08/087,942 filed Jul. 7, 1993 (now U.S. Pat. No. 5,369,054 granted Nov. 29, 1994) in the name of inventors Yeouchung Yen, Wenn-Jei Chen, Steven S. Chiang and Abdul R. Forouhi and entitled "Circuits for ESD Protection of Metal-to-Metal Antifuses During Processing" [ACT-063]; (2) U.S. patent application Ser. No. 08/290,029 filed Aug. 12, 1994 (now U.S. Pat. No. 5,498,895 granted Mar. 12, 1996) in the name of inventor Wenn-Jei Chen and entitled, "Process ESD Protection Device For Use With Antifuses" [ACT-143]; and (3) U.S. patent application Ser. No. 08/289,678 filed Aug. 12, 1994 now U.S. Pat. No. 5,572,061 granted Nov. 5, 1996 in the name of inventors Wenn-Jei Chen, Huan Tseng, Yeouchung Yen and Linda Liu and entitled, "ESD Protection Device for Antifuses with Top Polysilicon Electrode" [ACT-144]. The entirety of the above-identified patents and patent applications are hereby incorporated herein by reference as if set forth fully herein.

BACKGROUND OF THE INVENTION

1. Field of the Invention

The present invention relates to user-programmable antifuse technology. More particularly, the present invention relates to methods for fabricating antifuse devices as a part of a CMOS integrated circuit fabrication process. Still more particularly, the present invention relates to an edgeless, self-aligned, differential oxidation enhanced and diffusion-controlled minimum-geometry antifuse and method of fabrication.

2. The Prior Art

Numerous processes for fabrication of antifuses are known in the prior art. Some of these processes may be easily integrated into already existing integrated circuit fabrication processes. Some antifuse elements incorporate a dielectric antifuse material which contains a nitride or oxide such as silicon nitride or silicon dioxide, either as a single layer, or as a part of a multilayer dielectric such as that described in U.S. Pat. No. 4,823,181 to Mohsen et al. and U.S. Pat. No. 4,899,205 to Hamdy et al. Such structures exhibit excellent leakage and reliability characteristics, and are thus preferred for user-programmable antifuse applications.

Polysilicon/ONO/N+ Diffusion antifuse (ONO represents a three layer sandwich of oxide-nitride-oxide which acts as the antifuse material layer) has long been the choice as a production antifuse structure and process, but this process has suffered lately because it is difficult to scale in both the active antifuse cell dimension and antifuse thickness control during processing. When the active antifuse cell dimension grows, the defect density of the product having the same population of antifuses increases—thus smaller antifuses have a lower defect density and are desirable. The defect density of the product also increases when the antifuse thickness is reduced and the bottom oxide of the antifuse is grown directly over the N+ diffusion area.

OBJECTS AND ADVANTAGES OF THE INVENTION

Accordingly, it is an object of the present invention to provide an antifuse structure and method of fabrication which reduces the problems arising from the scaling down in size of current antifuse technology.

Another object of the present invention is to improve the defect density over the current antifuse manufacturing process.

A further object of the present invention is to provide an antifuse structure and methods of fabricating same which represents a substantial improvement in both antifuse density and defect density.

A further object of the present invention is to provide an antifuse which does not suffer from edge effects.

A further object of the present invention is to provide a self-aligning antifuse.

Yet another object of the present invention is to provide an antifuse having a precisely controlled antifuse material layer thickness and hence predictable breakdown voltage.

These and many other objects and advantages of the present invention will become apparent to those of ordinary skill in the art from a consideration of the drawings and ensuing description of the invention.

SUMMARY OF THE INVENTION

In current state of the art ONO antifuse technology, the bottom oxide of the ONO antifuse material layer is grown on N+ diffusion with the edge neighboring an isolation oxide layer of nearly 2000 Å maximum thickness. This edge is known to be potentially the weakest spot of the entire active antifuse area because the thermally grown antifuse material on this edge neighboring the isolation oxide is relatively thin and has higher physical stress and thus has a relatively low breakdown voltage which can result in the antifuse breaking down at its edge rather than at the center of the antifuse. As it is important to control precisely the breakdown voltage of the antifuse, this weak spot is undesirable. The present invention is directed to an antifuse structure and fabrication process wherein the bottom oxide of the ONO antifuse material layer is grown over a small area of N− diffusion surrounded by an N+ diffusion area where the N− diffusion could be patterned as N− "islands" or as N− "stripes", or the like, with the active N+ area controlled by the formation and drive-in of the N− diffusion layer. In this way, the bottom oxide layer of the ONO antifuse material layer is thinner at its center (above the N− region) than at its edges because oxide grows slower on the less doped N− region at the center of the antifuse than at the more heavily doped N+ regions at the edges of the antifuse. Forcing the center of the antifuse material layer to be thinner causes the antifuse to preferentially rupture or break down at its center and away from its edges. The opening in the antifuse cell opening mask is wider than the width of the N− diffusion area so that both N− and N+ areas are exposed in the antifuse cell opening step. Since the N+ diffusion can be very accurately dimensionally controlled with known techniques, it is thus possible to reduce the diameter or dimension of the active N– diffusion down to 0.2 µm or below, comparing favorably with the diameter of 1.0 µm used in currently available state-of-the-art manufacturing processes for antifuses. This represents a factor of 25 reduction in the active antifuse area, which in turn can both dramatically reduce the defect density of antifuses over current technology and dramatically increase the number of antifuses that may be disposed in a given area of semiconductor.

BRIEF DESCRIPTION OF THE DRAWINGS

FIG. 4i shows the final configuration of the antifuse.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The present invention is directed to an antifuse structure and fabrication method which can be used to fabricate antifuses of significantly decreased size with lower defect densities. According to the invention, a Polysilicon/ONO/N diffusion antifuse is constructed so that the N diffusion region at the bottom of the antifuse comprises a central region of relatively lightly doped N– surrounded by a region of more heavily doped N+. When the thermal oxidation step is carried out to form the bottom layer of the preferred ONO (oxide-nitride-oxide) antifuse material layer over the N+/N– diffusion regions, the oxide grows more quickly over the N+ regions than it does over the N– regions resulting in an oxide layer of non-uniform thickness—the layer is thinnest at the center of the N– region and thickest over the N+ regions because of the fact that oxide grows more quickly over more heavily N– doped areas.

Figure 1A:
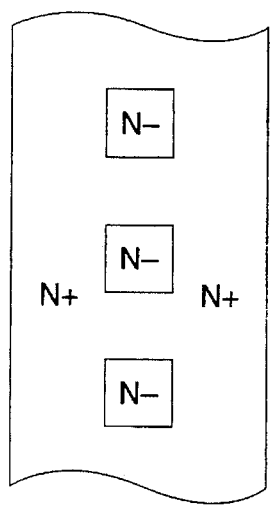
FIGS. 1a, 1b, 1c, 2a, 2b and 2c show various configurations of the antifuse of the present invention according to the preferred embodiments.
Figure 1B:
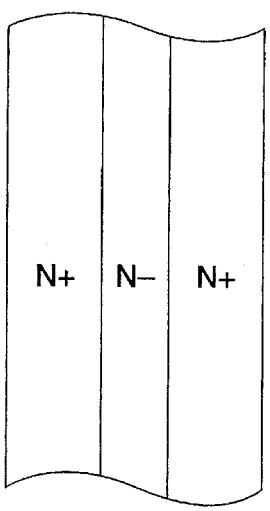
Figure 1C:
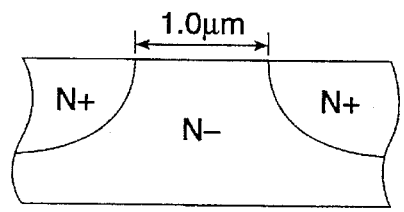
Figure 2A:
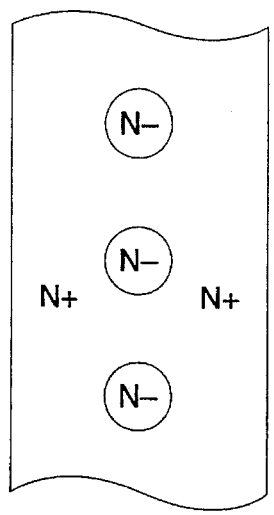
Figure 2B:
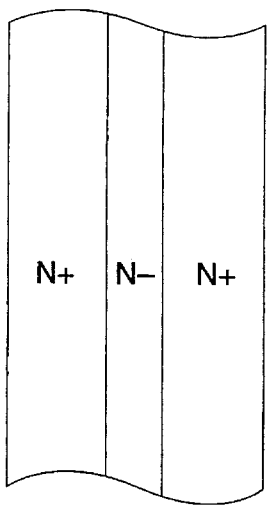
Figure 2C:
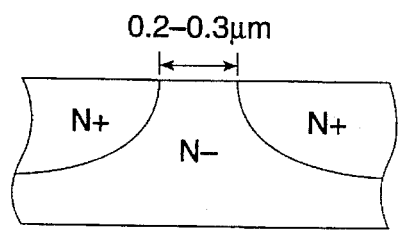

A number of configurations utilizing the invention are possible. Turning to the drawings, FIG. 1a shows a layout of square N– regions disposed within a larger N+ region. An antifuse may be formed over each N– region. FIG. 1b shows a layout comprising an N– stripe disposed within a larger N+ region. Antifuses may be formed bridging the N– stripes. Either of these configurations can be used to achieve the benefits of the present invention. FIG. 1c shows a 1.0 µm wide N– region surrounded by N+ regions which is representative of utilizing the present invention with current 1.0 µm technology to form antifuses of lower defect density due to the improved antifuse material layer. FIG. 2a shows a layout of round N– regions disposed within a larger N+ region, the so-called "island" version of the present invention. Each island may be an antifuse. FIG. 2b shows a layout comprising a thin N– stripe of width on the order of 0.2 µm–0.3 µm disposed within a larger N+ region. Again, antifuses may be formed to bridge the N– stripe. FIG. 2c shows a 0.2 µm–0.3 µm wide N– region surrounded by N+ regions which is representative of a preferred embodiment of the present invention which yields a 25-fold decrease in the area consumed by antifuses. In the claims the language "a lower antifuse electrode including an N+ diffusion region and an N– diffusion region disposed within said N+ diffusion region" is intended to include without limitation the various above-described configurations including specifically both "stripe" and "island" configurations.

Figure 3A:
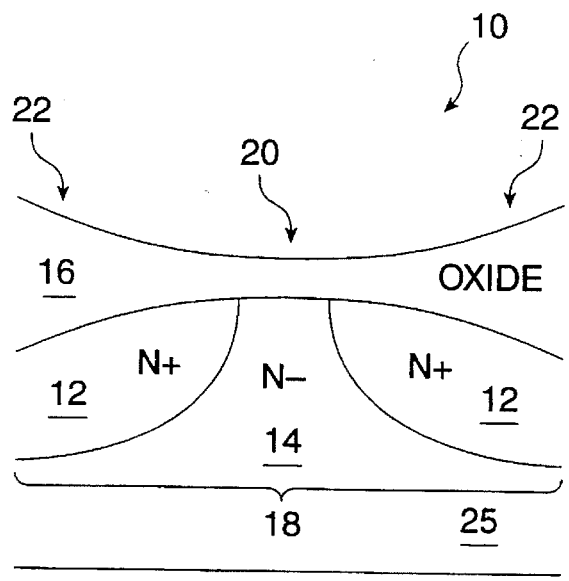
FIG. 3a shows a cross section of the antifuse of the present invention after formation of the isolation oxide layer.

FIG. 3a shows the basic configuration of the isolation oxide layer of the ONO antifuse material layer disposed over the N+/N– diffusion region of the present invention. At antifuse 10 N+ regions 12 surround N– region 14. N+ regions 12 are preferably doped to an impurity level after drive-in of from 1E19 to $1E22/cm^3$. N– region 14 is preferably doped to an impurity level after drive-in of from 1E15 to $1E19/cm^3$. Isolation oxide layer 16 is preferably thermally grown over N+/N–/N+ region 18. While not believed to be critical to the invention, because of the differential growth rates of oxide over differently doped N–doped silicon, isolation oxide layer 16 is thinnest directly over N– region 14 in the area designated 20 and thickest over the N+ regions 12 in the areas designated 22.

Figure 3B:
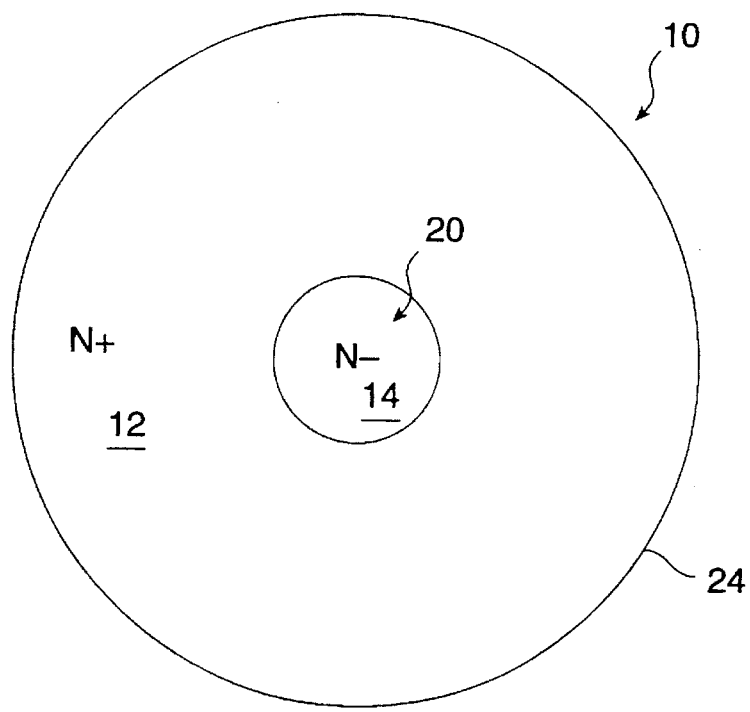
FIG. 3b shows the arrangement of N+ and N– regions in an antifuse according to a preferred embodiment of the present invention.

FIG. 3b is a top view of the antifuse 10 looking at the relative position of the N+ and N– regions. The thickness of a thermally grown oxide layer (not shown in FIG. 3b) disposed over the N+ and N– regions will be thickest at the edge of circle 24, the outer edge of the N+ region 12 and thinnest at 20, the center of the inner N– region 14.

Figure 4A:
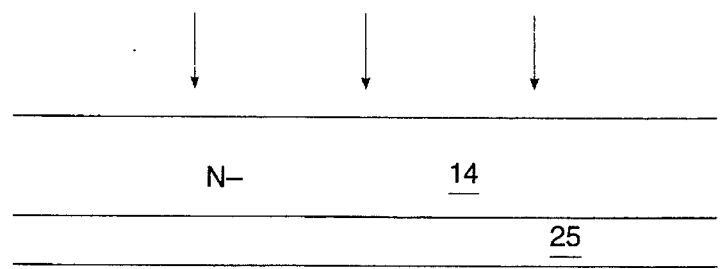
FIGS. 4a–4i show the structure of an antifuse according to a preferred embodiment of the present invention after various intermediate stages in the fabrication of the antifuse.
Figure 4B:
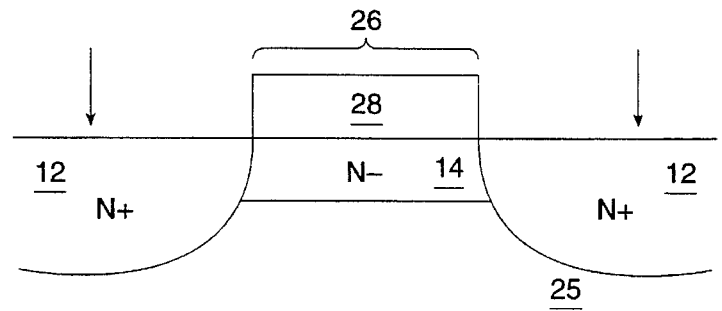
Figure 4C:
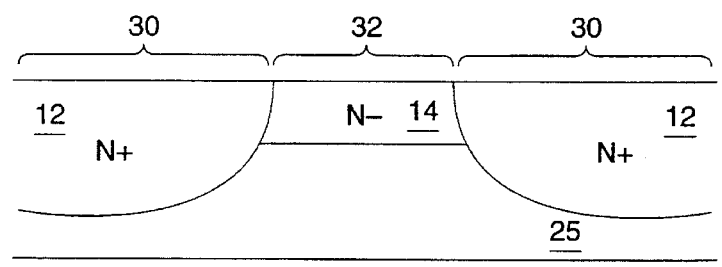
Figure 4D:
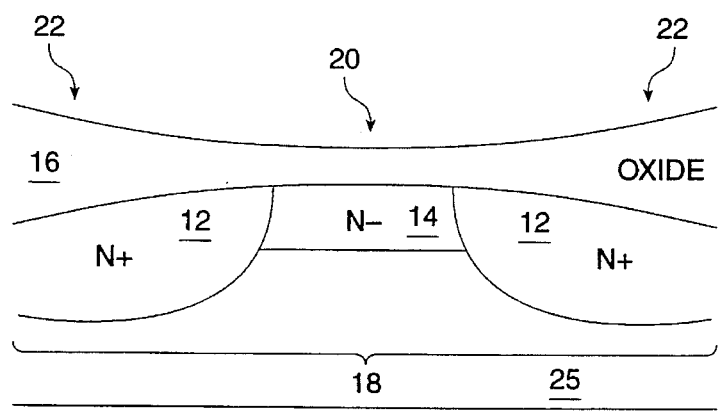

Turning now to FIGS. 4a–4i we will discuss the fabrication of antifuse 10 in detail. In FIG. 4a is depicted the N– implant and drive-in into a silicon substrate 25 of N– layer 14. Preferably, the N– diffusion is formed by Phosphor (P) or Arsenic (As) ion implantation with dose ranges from 1E11 to 5E14 and an ion implantation energy within the range of 25 KeV to 200 KeV. This is done in a conventional manner well known to those of ordinary skill in the art to achieve a doping level in layer 14 in the range of about $1E15/cm^3$ to about $1E19/cm^3$ with $1E17/cm^3$ presently preferred.

A portion 26 of N– region 14 is then masked with a resist layer 28 and regions 12 are then ion implanted to form the N+ diffusion. Preferably, the N+ diffusion is formed by Phosphor (P) or Arsenic (As)ion implantation with dose ranges from 1E14 to 5E16 and an ion implantation energy within the range of 25 KeV to 200 KeV. This is done in a conventional manner well known to those of ordinary skill in the art to achieve N+ regions with a doping level in the regions 12 in the range of about $1E19/cm^3$ to about $1E22/cm^3$ with $5E20/cm^3$ presently preferred.

The resist layer 28 should preferably be less than 1.0 µm in width in order to take advantage of the benefits of the present invention, e.g., higher densities over existing art. After annealing and drive-in, the N+ regions 12 should preferably extend at least 0.35 µm on each side of the N– region 14 as shown at 30. After the annealing and drive-in step is performed, the N– region will have a width in the range of 0.01 µm to 0.9 µm with about 0.2 µm–0.3 µm presently preferred as shown at 32 in FIG. 4c.

Next, a thermal oxidation is carried out to form isolation oxide layer 16 over the N+/N–/N+ region 18. As noted above, the isolation oxide layer is thinnest at its center 20 due to differential oxidation. Preferably, the thickness of isolation oxide layer 16 at area 20 is in the range of about 300 Å to about 1600 Å with 600 Å presently preferred. The thickness of isolation oxide layer 16 at areas 22 is in the range of about 1000 Å to about 2000 Å with 1500 Å presently preferred. The differential oxidation process used for formation of isolation oxide layer 16 is optimized with the oxide grown on the N– diffusion area in the range of 200 Å to 1500 Å thinner than the oxide grown on the N+ diffusion area.

When scaling the antifuse cell to smaller geometry, the impact of misalignment during the antifuse cell open patterning becomes very significant. In this invention, the active fuse cell (N– diffusion area) is controlled by formation of the N+ diffusion in that the N+ area will receive significant lateral diffusion from long thermal cycles during subsequent processing steps. The dimension of the N– diffusion area is controlled to below the intended antifuse cell open size by at least 0.1 µm or more dependent upon the desired misalignment tolerant target. In the past, antifuses became programmed at an unpredetermined point in the cell open area. An advantage of this invention permits the predetermination of the location of the programming or rupture spot of the antifuse to a small area within the larger cell open area which is much smaller than the cell open area and preferably centered within the cell open area so that it is relatively distant from edges.

An alternative approach is to use self-alignment wet oxide etch without a fuse cell open mask. After the N+ is implanted, the N+ will then have an anneal and drive-in cycle to form the N+ diffusion, which will grow oxides on the surface of both N– diffusion and N+ diffusion areas. Since this process is a differential oxidation by nature, the oxide grown on N+ diffusion will be much thicker than the oxide grown on the N– diffusion, where the N– diffusion is also used as active antifuse cell diffusion to grow active ONO as the antifuse material layer. If the thickness difference between the N– and N+ diffusion is significant with good controllability, the cell open etch can then be done with controllable wet etch process and the cell open mask eliminated. This approach will then save one processing mask and make the cell opening process become self-aligned.

Figure 4E:
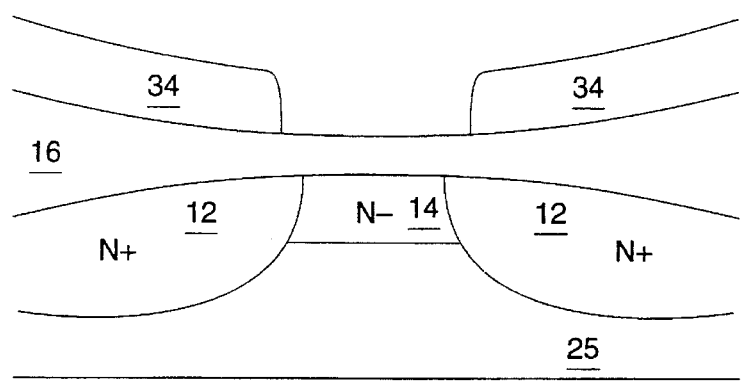
Figure 4F:
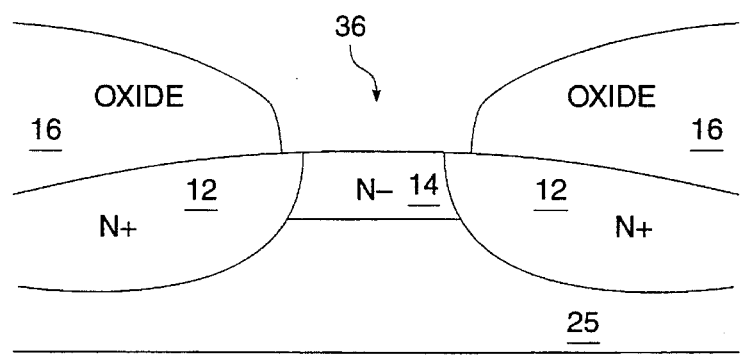
Figure 4G:
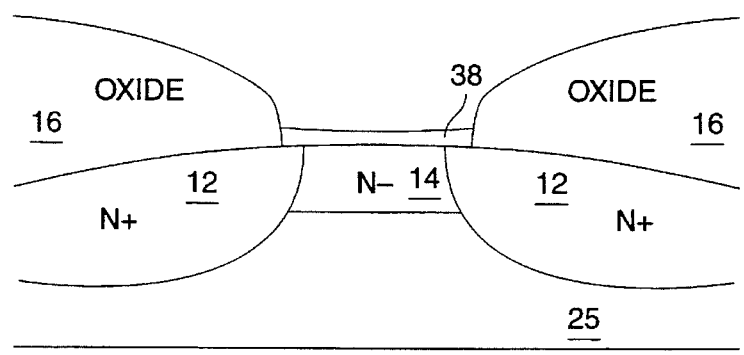
Figure 4H:
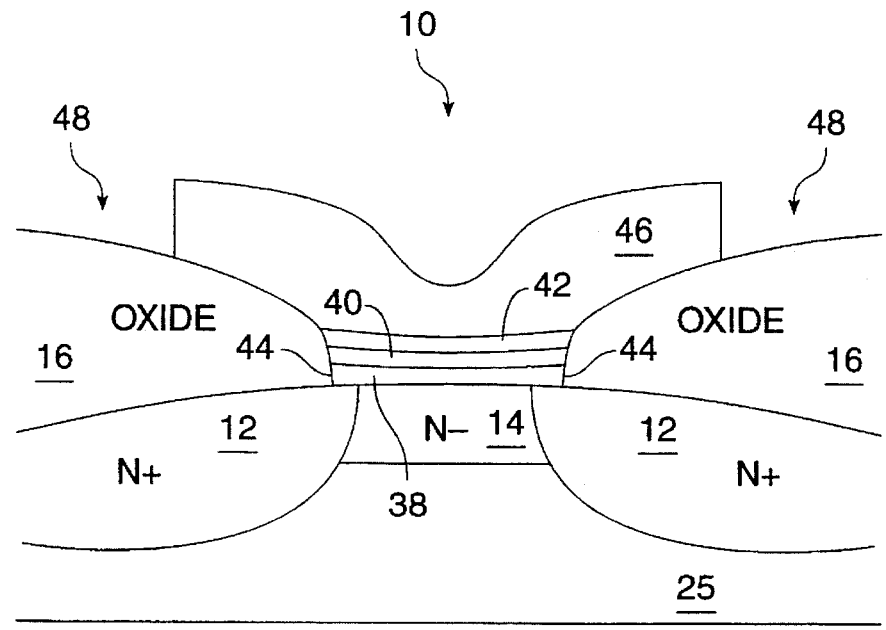
Figure 4I:
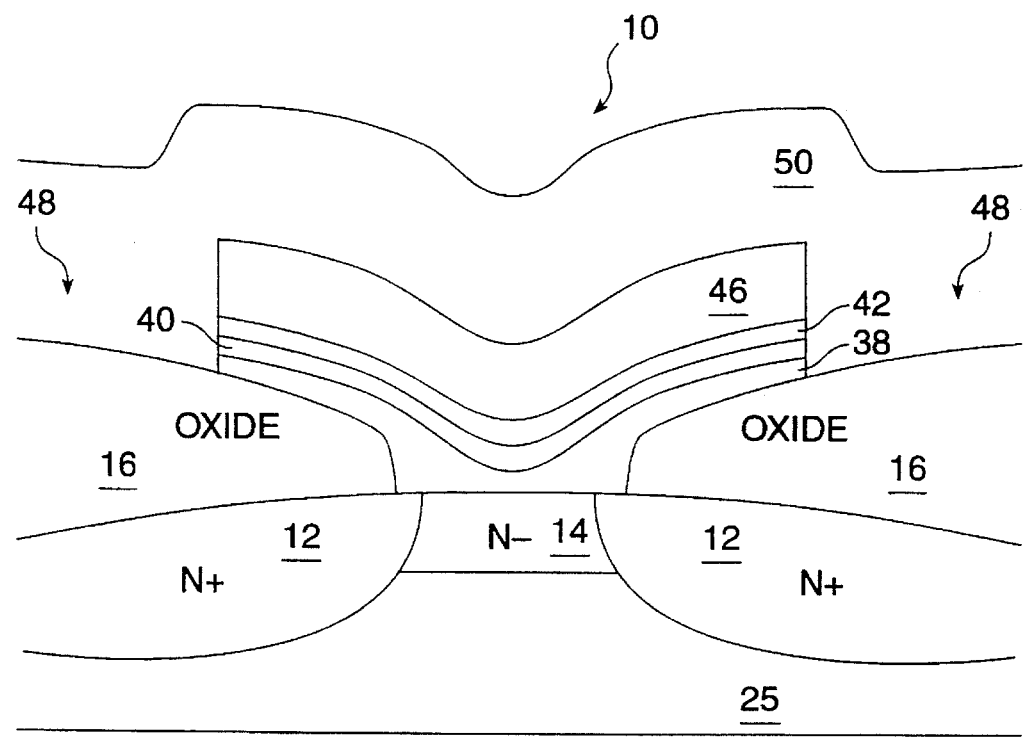

The next step shown in FIG. 4e is to form an alignment tolerant cell opening mask 34 over isolation oxide layer 16. This is done by having the mask opening be 0.05 µm to 1.0 µm larger in dimension than the already-formed active antifuse N– diffusion area. Since the cell open mask is therefore much bigger than the active antifuse N– diffusion area, the cell open mask is thus equipped with alignment tolerant capability. Isolation oxide layer 16 is then etched and mask 34 removed resulting in the structure shown in FIG. 4f with newly formed antifuse cell opening 36.

The ONO deposition is carried out in a conventional manner, i.e., a first layer of oxide 38 is formed in the conventional manner, followed by a layer of nitride 40 which is oxidized to form a second layer of oxide 42 completing the ONO composite antifuse material layer. The difference here is that first oxide layer 38 will have a non-uniform thickness due to its formation over an N+/N–/N+ structure resulting in differential oxidation as discussed above varying from a first thickness in the range of about 15 Å to about 100 Å with 40 Å presently preferred at the center of antifuse cell opening 36 to a second thickness in the range of about 20 Å to about 200 Å with 70 Å presently preferred at the edges 44 of the antifuse cell opening 36. Thus, the oxide grown on the N– diffusion area is thinner than the oxide grown on the N+ diffusion area by 0.5 Å to 100 Å. This differential thickness will force the antifuse to rupture when a voltage is applied to it closer to the center of the antifuse cell opening than if the ONO layers (38, 40, 42) were all of uniform thickness. Nitride layer 40 is then formed over first oxide layer 38 in a conventional manner and has a uniform thickness in the range of about 35 Å to about 200 Å with 70 Å presently preferred. Second oxide layer 42 is then formed over nitride layer 40 in a conventional manner and has a uniform thickness in the range of about 10 Å to about 80 Å with 30 Å presently preferred.

The next step is to deposit a thin polysilicon layer 46 as an antifuse cap over isolation oxide layer 16 and second oxide layer 42. Polysilicon layer 46 preferably has a uniform thickness in the range of about 100 Å to about 5000 Å with 1000 Å presently preferred. Polysilicon layer 46 is then either lightly doped or left undoped as discussed in U.S. patent application Ser. No. 08/289,678 identified further above and incorporated herein by reference. A conventional drive-in step is then performed and then the device is masked and etched with a low-power isotropic etch to remove polysilicon layer 46 in areas not immediately above antifuse 10 making sure to strip any remaining nitride from over isolation oxide layer 16 (such as at areas 48) to prevent leakage—the etch can stop either at isolation oxide layer 16 or first oxide layer 38 overlying isolation oxide layer 16 (not shown). Finally, a top polysilicon layer 50 (FIG. 4i) may be deposited over the entire structure in the conventional manner.

The above-defined structure may be modified to form an N– stripe in a region of N+. The remainder of the structure would be essentially the same with the antifuses forming bridges across the N– stripe.

The primary advantages of the above-defined structures are: (1) the reduction of the size of the antifuse opening from about 1.0 µm using present technology to as little as about 0.2 µm with a corresponding 25 fold reduction in the area required for the antifuse and a corresponding reduction in the defect density of the antifuses due to their smaller size; (2) formation of as essentially "edgeless" antifuse by eliminating the edge effects and forcing the antifuse to rupture in the center due to the contour of the first (bottom) oxide layer of the ONO antifuse material layer; (3) the cell opening is alignment tolerant because the active N– antifuse area is much smaller than the area of the cell opening (cell opening size); (4) N++ may be merged by lateral thermal diffusion with later transistors and during subsequent thermal cycles; (5) growing ONO over an N– region provides better oxide integrity and process control capability for thickness scaling because thermal oxidation over N– regions has much lower growth rate than over an N+ region; (6) the improved thickness scaling capability will result in a lower programming voltage and/or shorter antifuse programming times than available with current well known antifuse technology.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An antifuse comprising:

a lower antifuse electrode including an N– diffusion region disposed within, surround by and in contact with an N+ diffusion region disposed generally about a vertical axis of said N– diffusion region;

an isolation layer means;

an antifuse cell opening of a first area in and through said isolation layer means;

an upper electrode means;

an antifuse material layer disposed between said lower antifuse electrode and said upper electrode means and over and in contact with said lower antifuse electrode; and means for rupturing said antifuse within a predetermined second area much smaller than said first area, said second area being at a predetermined location confined within said antifuse cell opening, said means including causing said antifuse material layer deposited over said lower antifuse electrode to be of a first minimum thickness in a region over said N+ diffusion region and of a second minimum thickness in a region over said N− diffusion region, said first minimum thickness being greater than said second minimum thickness.

2. An antifuse comprising:

a lower antifuse electrode including an N− diffusion region in the shape of a trench disposed within, surrounded on either side of said trench by and in contact with an N+ diffusion region;

an isolation layer means;

an antifuse cell opening of a first area in and through said isolation layer means;

an upper electrode means;

an antifuse material layer disposed between said lower antifuse electrode and said upper electrode means and over and in contact with said lower antifuse electrode; and means for rupturing said antifuse within a predetermined second area much smaller than said first area, said second area being at a predetermined location confined within said antifuse cell opening, said means including causing said antifuse material layer deposited over said lower antifuse electrode to be of a first minimum thickness in a region over said N+ diffusion region and of a second minimum thickness in a region over said N− diffusion region, said first minimum thickness being greater than said second minimum thickness.

3. An antifuse disposed over a silicon substrate comprising:

a lower antifuse electrode including an N− diffusion region disposed adjacent to and in contact with an N+ diffusion region, said N+ diffusion region surrounging said N− diffusion region;

an isolation oxide layer disposed over said lower antifuse electrode;

an antifuse cell opening of a first area in and through said isolation oxide layer;

an antifuse material layer disposed in said antifuse cell opening and over and in physical contact with said N− diffusion region, said antifuse material layer including a first oxide layer of non-uniform thickness having its thinnest portion directly over said N− diffusion region; and an upper antifuse electrode disposed over said antifuse material layer;

wherein said antifuse is adapted to rupture within a second area much smaller than said first area, said second area being at a predetermined location within said antifuse cell opening and located above said N− diffusion region.

4. An antifuse comprising:

a lower antifuse electrode including an N− diffusion region disposed adjacent to and in contact with an N+ diffusion region;

an isolation oxide layer disposed over said lower antifuse electrode;

an antifuse cell opening of a first area in and through said isolation oxide layer;

an antifuse material layer disposed in said antifuse cell opening and over and in physical contact with said N− diffusion region, said antifuse material layer including a first oxide layer of non-uniform thickness having its thinnest portion directly over said N− diffusion region; and an upper antifuse electrode disposed over said antifuse material layer;

wherein said antifuse is adapted to rupture within a second area much smaller than said first area, said second area being at a predetermined location within said antifuse cell opening and located over said N− diffusion region.

5. An antifuse disposed over a semiconductor substrate comprising:

a lower antifuse electrode including an N+ diffusion region and an N− diffusion region disposed within said N+ diffusion region;

an isolation oxide layer disposed over said lower antifuse electrode;

an antifuse cell opening in and through said isolation oxide layer;

an antifuse material layer disposed in said antifuse cell opening, said antifuse material layer comprising a first oxide layer disposed over and in contact with said N− diffusion region, said first oxide layer having a non-uniform thickness with its thinnest portion located over said N− diffusion region;

an upper antifuse electrode disposed over and in electrical contact with said antifuse material layer.

6. An antifuse according to claim 5 wherein said antifuse cell opening is centered over said N− diffusion region.

7. An antifuse according to claim 5 wherein said antifuse material layer further comprises:

a layer of nitride disposed over said first oxide layer and a second layer of oxide disposed over said nitride layer.

8. An antifuse according to claim 5 wherein said upper antifuse electrode comprises at least one layer of doped polysilicon.

9. An antifuse according to claim 7 wherein said upper antifuse electrode comprises at least one layer of doped polysilicon.

10. An antifuse according to claim 5 wherein said upper electrode comprises a first layer of polysilicon disposed over said antifuse material layer and a second layer of doped polysilicon disposed over said isolation oxide layer and said first layer of polysilicon.

11. An antifuse according to claim 5 wherein said isolation oxide layer is of non-uniform thickness and has an oxide thickness over said N− diffusion region which is thinner than the oxide thickness over said N+ diffusion region in the range of 200 Å to 1500 Å.

12. An antifuse according to claim 5 wherein said first oxide layer has an oxide thickness over said N− diffusion region which is thinner than the oxide thickness over said N+ diffusion region in the range of 0.5 Å to 100 Å.

13. An antifuse according to claim 5 wherein said N− diffusion region has a width within the range of 0.01 μm–0.9 μm.

14. An antifuse according to claim 12 wherein said N− diffusion region has a width within the range of 0.01 μm–0.9 μm.

15. An antifuse disposed over a silicon substrate comprising:

a lower antifuse electrode including an N− diffusion region disposed within, surrounded by and in contact with an N+ diffusion region disposed generally about a vertical axis of said N− diffusion region;

an isolation oxide layer disposed over said lower antifuse electrode;

an antifuse cell opening in and through said isolation oxide layer;

an antifuse material layer disposed in said antifuse cell opening and over and in physical contact with said N− diffusion region, said antifuse material layer including a first oxide layer of non-uniform thickiness having its thinnest portion directly over said N− diffusion region; and an upper antifuse elecitrode disposed over said antifuse material layer.

16. An antifuse according to claim 15 wherein said antifuse material layer further comprises:

a layer of nitride disposed over said first oxide layer and a second layer of oxide disposed over said nitride layer.

17. An antifuse according to claim 15 wherein said upper antifuse electrode comprises a layer of doped polysilicon.

18. An antifuse according to claim 16 wherein said upper antifuse electrode comprises a layer of doped polysilicon.

19. An antifuse according to claim 15 wherein said isolation oxide layer is of non-uniform thickness and has an oxide thickness over said N− diffusion region which is thinner than the oxide thickness over said N+ diffusion region in the range of 200 Å to 1500 Å.

20. An antifuse according to claim 15 wherein said first oxide layer has an oxide thickness over said N− diffusion region which is thinner than the oxide thickness over said N+ diffusion region in the range of 0.5 Å to 100 Å.

21. An antifuse according to claim 15 wherein said N− diffusion region has a width within the range of 0.01 μm–0.9 μm.

22. An antifuse according to claim 20 wherein said N− diffusion region has a width within the range of 0.01μm–0.9 μm.

23. A method of fabricating an antifuse comprising the following:

(a) performing a blanket N− implant over a first region of a semiconductor substrate;

(b) performing an N− drive-in;

(c) forming an N+ implant mask over a first portion of said first region;

(d) performing an N+ implant into a second portion of said first region not protected by said N+ implant mask and surrounding said N+ implant mask, said N+ implant forming an N+ region surrounding and in contact with said first portion of said first region;

(e) removing said implant mask;

(f) performing an N+ anneal and drive-in to form an N+ diffusion region in and adjacent to said second portion and leaving an N− diffusion region within said first region surrounded by said N+ diffusion region;

(g) forming an isolation oxide layer over said first and second portion;

(h) masking with a cell open mask and etching said isolation oxide layer to open an antifuse cell opening therein exposing at least a portion of said N+ diffusion region and at least a portion of said N− diffusion region;

(i) forming an antifuse material layer in said antifuse cell opening including the formation of a first oxide layer over and in contact with said at least a portion of said N+ diffusion region and said at least a portion of said N− diffusion region, said first oxide layer having a non-uniform thickness with its thinnest part located over said at least a portion of said N− diffusion region; and (j) forming an upper antifuse electrode over said antifuse material layer.

24. A method of fabricating an antifuse comprising the following:

(a) forming an N− diffusion region over a first region of a semiconductor substrate;

(b) forming an implant mask over and protecting a first portion of said first region;

(c) implanting an N+ region into a second portion of said first region surrounding and not protected by said N+ implant mask;

(d) removing said implant mask;

(e) forming an N+ difiusion region in and adjacent to said second portion of said first region and leaving an N− diffusion region within said first portion of said first region, said N+ diffusion region surrounding and in contact with said N− diffusion region;

(f) forming an isolation oxide layer over said first and second portion of said first region;

(g) masking with a cell open mask and etching said isolation oxide layer to open an antifuse cell opening therein exposing at least a portion of said N+ diffusion region and at least a portion of said N− diffusion region, said exposed portion of said N+ diffusion region surrounding said exposed portion of said N− diffusion region;

(h) forming an antifuse material layer in said antifuse cell opening including the formation of a first oxide layer over and in contact with said at least a portion of said N+ diffusion region and said at least a portion of said N− diffusion region, said first oxide layer having a non-uniform thickness with its thinnest part located over said at least a portion of said N− diffusion region; and (i) forming an upper antifuse electrode over said antifuse material layer.

25. A method of fabricating an antifuse comprising the following:

(a) forming an N− diffusion region over a first region of a semiconductor substrate;

(b) forming an implant mask over and protecting a first portion of said first region;

(c) implanting an N+ region into a second portion of said first region surrounding and not protected by said N+ implant mask;

(d) removing said implant mask;

(e) forming an N+ diffusion region in and adjacent to said second portion of said first region and leaving an N− diffusion region within said first portion of said first region;

(f) forming an isolation oxide layer over said first and second portion of said first region;

(g) wet oxide etching without a fuse cell open mask said isolation oxide layer to open an antifuse cell opening therein exposing at least a portion of said N+ diffusion region and at least a portion of said N− diffusion region;

(h) forming an antifuse material layer in said antifuse cell opening including the formation of a first oxide layer over and in contact with said at least a portion of said N+ diffusion regions and said at least a portion of said N− diffusion region, said first oxide layer having a non-uniform thickness with its thinnest part located over said at least a portion of said N− diffusion region; and (i) forming an upper antifuse electrode over said antifuse material layer.

26. A method of fabricating an antifuse according to claim 23 wherein said cell open mask has an opening in the range of 0.05 μm to 1.00 μm larger in dimension than the width of said N− diffusion region thus providing alignment tolerant capability.

27. A method of fabricating an antifuse according to claim 24 wherein said cell open mask has an opening in the range of 0.05 μm to 1.00 μm larger in dimension than the width of said N− diffusion region thus providing alignment tolerant capability.

* * * * *

UNITED STATES PATENT AND TRADEMARK OFFICE
CERTIFICATE OF CORRECTION

PATENT NO. : 5,619,063
DATED : April 8, 1997
INVENTOR(S) : Wenn-Jei Chen and Huan-Chung Tseng It is certified that error appears in the above-indentified patent and that said Letters Patent is hereby corrected as shown below:

<u>On the first page</u>:

Amend the title to read --EDGELESS, SELF-ALIGNED, DIFFERENTIAL OXIDATION ENHANCED AND DIFFUSION-CONTROLLED MINIMUM-GEOMETRY ANTIFUSE AND METHOD OF FABRICATION--.

<u>In the specification</u>:

Column 4, line 19: replace "1E19 /cm$^3$" with --1E19/cm$^3$--.

Column 4, line 51: replace "1E19 /cm$^3$" with --1E19/cm$^3$--.

<u>In the claims</u>:

Column 6, line 62: replace "surround" with --surrounded--.
Column 7, line 16: replace "Anantifuse" with --An antifuse--.
Column 10, line 19: replace "dififusion" with --diffusion--.

Signed and Sealed this

Fifth Day of August, 1997

Attest:

BRUCE LEHMAN

*Attesting Officer*   *Commissioner of Patents and Trademarks*